United States Patent
Lee et al.

(10) Patent No.: US 6,937,478 B2
(45) Date of Patent: Aug. 30, 2005

(54) LOW PROFILE CIRCUIT DEVICE FOR LIQUID CRYSTAL DISPLAY AND METHOD FOR MANUFACTURING THE SAME

(75) Inventors: Chi Tien Lee, Tainan (TW); Jiunn Yau Huang, Nanzhou Shiang (TW)

(73) Assignee: Hannstar Display Corp. (TW)

(*) Notice: Subject to any disclaimer, the term of this patent is extended or adjusted under 35 U.S.C. 154(b) by 376 days.

(21) Appl. No.: 10/140,375

(22) Filed: May 8, 2002

(65) Prior Publication Data

US 2002/0167805 A1 Nov. 14, 2002

(30) Foreign Application Priority Data

May 9, 2001 (TW) .......................................... 90111392 A

(51) Int. Cl.[7] ................................................ H05K 1/18
(52) U.S. Cl. ....................................... 361/761; 361/760
(58) Field of Search ................................ 361/760–761, 361/749–750, 790, 803; 174/254–258, 260–261; 349/147–150; 257/686

(56) References Cited

U.S. PATENT DOCUMENTS

| | | | | |
|---|---|---|---|---|
| 4,549,174 A | * | 10/1985 | Funada et al. | 349/150 |
| 5,386,343 A | * | 1/1995 | Pao | 361/761 |
| 5,412,538 A | * | 5/1995 | Kikinis et al. | 361/792 |
| 5,923,939 A | | 7/1999 | Koyama | |
| 6,154,371 A | * | 11/2000 | Oba et al. | 361/764 |
| 6,160,718 A | * | 12/2000 | Vakilian | 361/803 |
| 6,677,664 B2 | * | 1/2004 | Inoue et al. | 257/668 |

* cited by examiner

*Primary Examiner*—Kamand Cuneo
*Assistant Examiner*—Tuan Dinh

(57) ABSTRACT

A low profile circuit device for the LCD module comprises a printed circuit board and an electronic device. The printed circuit board has a through hole and a plurality of pads surrounding the through hole. The electronic device is disposed within the through hole and has a plurality of leads electrically connected to and mounted on the plurality of pads of the printed circuit board.

12 Claims, 3 Drawing Sheets

LOW PROFILE CIRCUIT DEVICE FOR LIQUID CRYSTAL DISPLAY AND METHOD FOR MANUFACTURING THE SAME

CROSS REFERENCE TO RELATED APPLICATION

This application claims the priority benefit of Taiwan application serial no. 90111392, filed May 9, 2001, the full disclosure of which is incorporated herein by reference.

BACKGROUND OF THE INVENTION

1. Field of the Invention

The present invention generally relates to a low profile circuit device, and more particularly to a low profile circuit device having an improved surface-mounted device to decrease the entire height of the circuit devices of a liquid crystal display module.

2. Description of the Related Art

Due to the advance of electronic technology, especially for the popularity of portable electronic products, the requirements of light, compact and low-energy consuming display are gradually increasing. With the advantages of low-energy consuming, low-heat dissipation, light weight and non-luminescence, liquid crystal displays (LCD) have been widely used in the electronic products and even have replaced the traditional CRT displays.

An LCD basically comprises polarizers, glass electrodes and liquid crystal materials. The polarizers are made of the polarizer material sandwiched between two transparent films. The glass electrodes are made of high quality flat glass which is plated with a layer of conductive film of metallic oxidation. The molecules of liquid crystal material possess very strong electron conjugation moving ability. When the liquid crystal molecules are influenced by electric field, they are easily polarized to produce induced dipolar phenomena, thereby resulting in the displaying image in the LCD. The manufacturing process of LCD substantially includes the steps of injecting the liquid crystal material into the space between the two flat glasses with glass electrodes thereon, and adhering polarizer films onto the outer surfaces of the flat glasses so as to form the LCD cell. Then the driving circuits, controlling circuits, and backlight components etc. will be assembled to constitute an LCD module.

Now referring to FIG. 1, it depicts a schematic sectional diagram of a printed circuit board 13 in prior art which is attached to the LCD module and is provided with a surface mounted device 11 such as the driving integrated circuit and the controlling integrated circuit of the LCD. The surface mounted device 11 is electrically connected to and is mounted on the printed circuit board 13 by way of a bent lead 12. Typically, the height of the printed circuit board 13 is about 0.6 mm and the height of the surface mounted device 11 is about 1.2 mm, so the entire height H thereof is about 1.8~2.0 mm.

Also referring to FIG. 2, it depicts a schematic sectional diagram of the prior art printed circuit board 13 connected to an LCD panel 31 by way of a flexible substrate 34. As shown in the drawings, since the printed circuit board 13 is attached against a back light module 32 beneath the LCD module by way of the flexible substrate 34, the height of the printed circuit board 13 and the height of the electronic devices thereon critically affect the thickness of the LCD.

Accordingly, there exist the needs for providing a low profile circuit device to decrease the thickness of an LCD module and further decrease the thickness of an LCD.

SUMMARY OF THE INVENTION

It is a primary object of the present invention to provide a low profile circuit device for the LCD module in order to substantially decrease the thickness of the circuit device and further decrease the thickness of the LCD module.

It is another object of the present invention to provide a low profile circuit device for the LCD module, wherein the electronic devices disposed on the circuit device are semiconductor packages and mounted on a printed circuit board by surface mounted technology.

In order to achieve the above objects, the present invention provides a low profile circuit device for the LCD module comprising a printed circuit board and an electronic device. The printed circuit board has a through hole and a plurality of pads surrounding the through hole. The electronic device is disposed within the through hole and has a plurality of leads electrically connected to and mounted on the plurality of pads of the printed circuit board.

According to another aspect of the present invention, the electronic device is a semiconductor package.

According to a further aspect of the present invention, the circuit device is a driving circuit and/or a controlling circuit and is electrically connected to a liquid crystal display panel of the LCD module by way of a flexible substrate, and the flexible substrate is curved to allow a surface of the printed circuit board of the circuit device to abut against the LCD module.

According to still another aspect of the present invention, the electronic device is mounted on the printed circuit board by surface mounted technology.

According to further another aspect of the present invention, the plurality of leads are substantially horizontal and flat.

BRIEF DESCRIPTION OF THE DRAWINGS

Other objects, advantages, and novel features of the invention will become more apparent from the following detailed description when taken in conjunction with the accompanying drawing.

FIG. 3b is a schematic top plan view of the circuit device shown in FIG. 3a.

DESCRIPTION OF THE PREFERRED EMBODIMENT

Figure 3A:
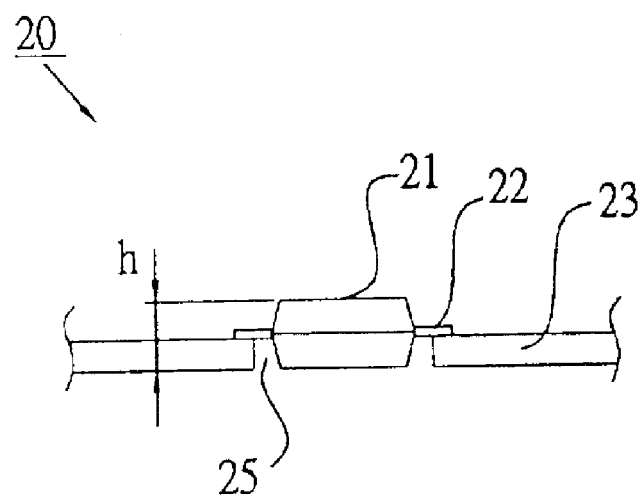
FIG. 3a is a schematic sectional view of a low profile circuit device for an LCD module according to the present invention.
Figure 3B:
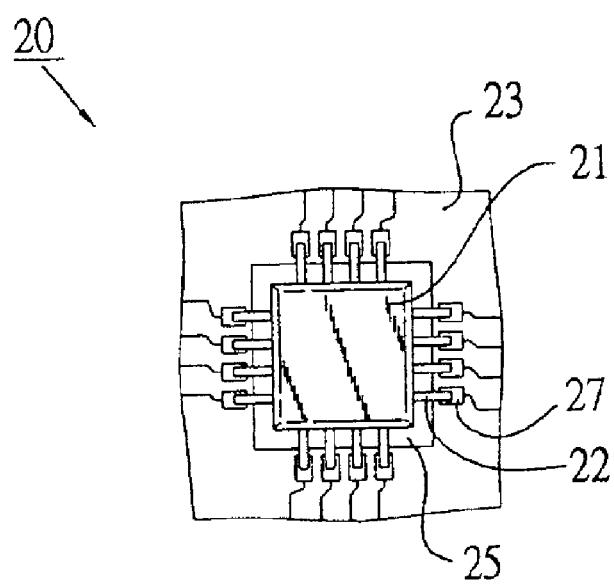
Figure 4:
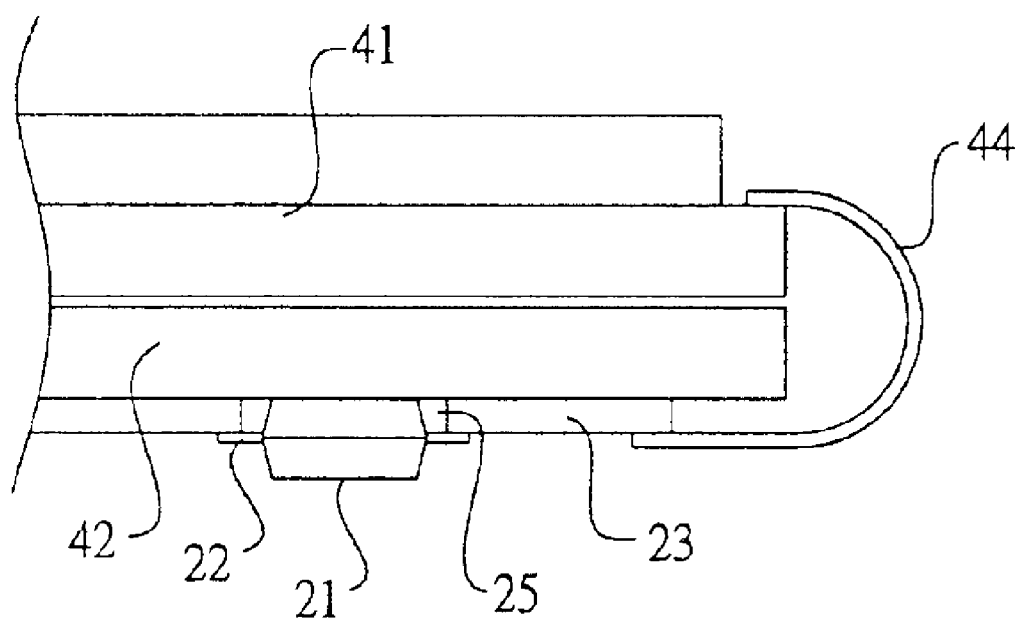
FIG. 4 is a schematic sectional view of an LCD module to which the circuit device shown in FIG. 3a and FIG. 3b is applied.

Now referring to FIGS. 3a and 3b, they depict a circuit device 20 according to the present invention which is provided with a printed circuit board 23 having a substantially rectangular through hole 25. As shown in FIG. 3a, an electronic device 21 is located in the through hole 25 and is a surface mounted device which has substantially horizontal flat leads 22 to electrically connect to and mount on a plurality of pads 27 of the printed circuit board 23 by surface mounted technology. In addition, the electronic device 21 may be a variety of electronic members, such as a resistor, an inductor and an electronic element of a semiconductor package. Now referring to FIG. 4, it depicts a schematic sectional view of the circuit device 20 according to the present invention which is applied to an LCD module. The circuit device 20 is a driving circuit and/or a controlling circuit of the LCD module and is connected to an LCD panel 41 of the LCD module by way of a flexible substrate 44. The flexible substrate 44 is curved to allow the lower surface of the circuit device 20 to abut against a back light module 42 of the LCD module. Thus, as the height H of the circuit device 20 is decreased, the thickness of the LCD module can be decreased. Preferably, the lower surface of the electronic device 21 is flush with the lower surface of the printed circuit board 23, thereby minimizing the entire height of the circuit device 20 according to the present invention and abutting the lower surface of the circuit device 20 against the back light module 42 of the LCD.

Figure 1:
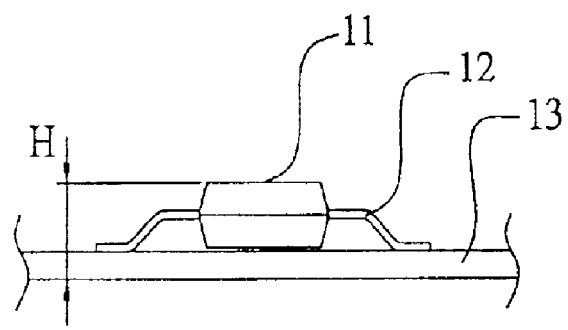
FIG. 1 is a schematic sectional view of a printed circuit board in prior art on which a surface mounted device is mounted.
Figure 2:
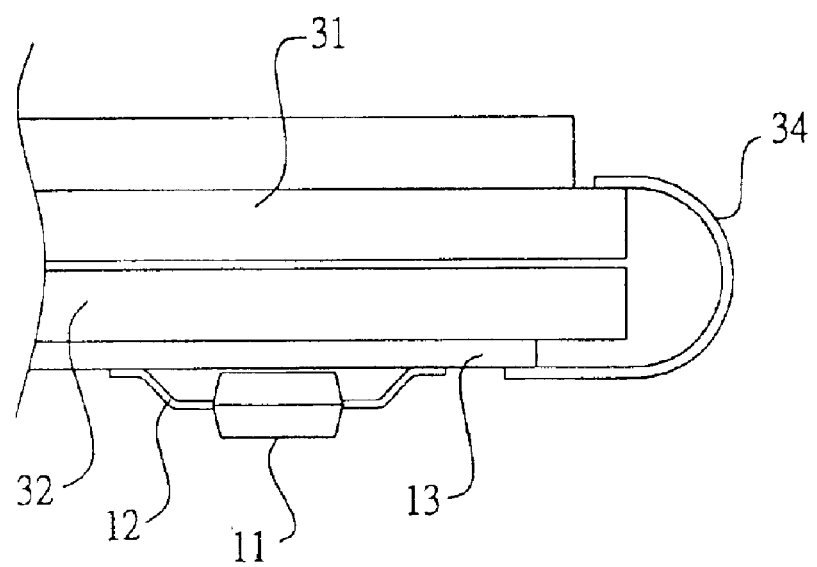
FIG. 2 is a schematic sectional view of an LCD module to which the printed circuit board shown in FIG. 1 is applied.

Conventionally, as shown in FIG. 1, the height of the conventional printed circuit board 13 is about 0.6 mm and the height of the surface mounted device 11 is about 1.2 mm, so the entire height H of the circuit device is about 1.8~2.0 mm. According to the present invention, as shown in FIG. 3a, the height of the printed circuit board 23 is also about 0.6 mm and the height of the electronic device 21 is still about 1.2 mm. However, since the electronic device 21 partly sinks into the through hale 25 of the printed circuit board 23, the entire height h of the circuit device 20 is 1.2 mm. Compared with the prior art, the height h of circuit device 20 according to the present invention is decreased by about 0.6~0.8 mm. Additionally, as shown in FIG. 1, the leads 12 of the surface mounted device 11 must be bent to mount on the printed circuit board 13 through the surface mounted technology. The bent leads 12 are usually formed by pressing process. However, the electronic device 21 according to the present invention is provided with the horizon flat leads 22 without the pressing process so as to further increase the yield and reduce the cost.

As the foregoing description, the entire height of the low profile circuit device according to the present invention is effectively decreased and, when the low profile circuit is applied to an LCD module, the thickness of the LCD module is effectively decreased.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A low profile circuit device disposed on a liquid crystal display (LCD) module, the low profile circuit device comprising:

a printed circuit board having a through hole and a plurality of pads surrounding the through hole; and an electronic device disposed within the through hole and having a plurality of leads electrically connected to and mounted on the plurality of pads of the printed circuit board, wherein a surface of the printed circuit board is abutted against the LCD module and the electronic device is flush with the surface of the printed circuit board that abuts against the LCD module.

2. The low profile circuit device as claimed in claim 1, wherein the electronic device is a semiconductor package.

3. The low profile circuit device as claimed in claim 1, wherein the electronic device is a driving circuit and/or a controlling circuit of the LCD module.

4. The low profile circuit device as claimed in claim 1, wherein the electronic device is mounted on the printed circuit board by surface mounted technology.

5. The low profile circuit device as claimed in claim 1, wherein the plurality of leads are substantially horizontal and flat.

6. The low profile circuit device as claimed in claim 3, wherein the circuit device is electrically connected to a liquid crystal display panel of the LCD module by way of a flexible substrate.

7. A method of manufacturing a low profile circuit device disposed on a liquid crystal display (LCD) module, the method comprising the steps of:

providing a printed circuit board having a through hole and a plurality of pads surrounding the through hole;

disposing at least one electronic device within the through hole and the electronic device having a plurality of leads;

electrically connecting the leads to and mounting the leads on the plurality of pads of the printed circuit board to form the circuit device; and disposing the printed circuit board and the electronic device of the circuit device on the LCD module, wherein a surface of the printed circuit board is abutted against the LCD module and the electronic device is flush with the surface of the printed circuit board that abuts against the LCD module.

8. The method as claimed in claim 7, wherein the electronic device is a semiconductor package.

9. The method as claimed in claim 7, wherein the electronic device is a driving circuit and/or a controlling circuit of the LCD module.

10. The method as claimed in claim 7, wherein the electronic device is mounted on the printed circuit board by surface mounted technology.

11. The method as claimed in claim 7, wherein the plurality of leads are substantially horizontal and flat.

12. The method as claimed in claim 9, further comprising electrically connecting the circuit device to a liquid crystal display panel of the LCD module by way of a flexible substrate.

* * * * *